United States Patent
Wang et al.

(10) Patent No.: US 8,790,149 B2
(45) Date of Patent: Jul. 29, 2014

(54) METHOD OF FABRICATING FLEXIBLE DISPLAY DEVICE

(75) Inventors: Chun-Jan Wang, Hsin-Chu (TW); Chia-Hao Chang, Hsin-Chu (TW); Chih-Jen Yang, Hsin-Chu (TW); Chuan-Hsiu Chang, Hsin-Chu (TW); Lan-Kai Yeh, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/586,846

(22) Filed: Aug. 15, 2012

(65) Prior Publication Data
US 2013/0171902 A1 Jul. 4, 2013

(30) Foreign Application Priority Data
Dec. 30, 2011 (TW) .............................. 100149963 A

(51) Int. Cl.
*H01J 9/26* (2006.01)
*H01J 9/32* (2006.01)

(52) U.S. Cl.
USPC ............... 445/25; 445/24; 313/506; 313/509; 313/511; 313/512; 428/206; 427/71; 427/122; 427/97.2

(58) Field of Classification Search
USPC .................. 445/24–25, 49–51; 313/498–512; 428/206, 204; 438/26, 28; 257/E51.04; 427/58, 71, 97.2, 97.7, 122
See application file for complete search history.

(56) References Cited

U.S. PATENT DOCUMENTS

| | | | | |
|---|---|---|---|---|
| 6,130,774 | A * | 10/2000 | Albert et al. .................. | 359/296 |
| 8,287,325 | B2 * | 10/2012 | Furukawa et al. .............. | 445/25 |
| 2004/0232833 | A1 | 11/2004 | Menda | |
| 2006/0105200 | A1 * | 5/2006 | Poplavskyy et al. .......... | 428/690 |
| 2006/0202220 | A1 * | 9/2006 | Hayashi .......................... | 257/98 |
| 2009/0315457 | A1 * | 12/2009 | Furukawa et al. ............ | 313/504 |
| 2010/0117072 | A1 | 5/2010 | Ofuji et al. | |
| 2010/0157131 | A1 * | 6/2010 | Kamatani et al. ........ | 348/333.11 |
| 2011/0043479 | A1 | 2/2011 | van Aerle | |
| 2011/0062992 | A1 | 3/2011 | Okazaki et al. | |
| 2013/0099658 | A1 * | 4/2013 | Tsai et al. ..................... | 313/504 |
| 2013/0240794 | A1 * | 9/2013 | Leung et al. .................. | 252/500 |

FOREIGN PATENT DOCUMENTS

| | | |
|---|---|---|
| CN | 1575048 A | 2/2005 |
| TW | 200712571 | 4/2007 |
| TW | 200738455 | 10/2007 |
| TW | 200913255 | 3/2009 |
| TW | 200933558 | 8/2009 |
| TW | 201126696 | 8/2011 |

* cited by examiner

*Primary Examiner* — Nimeshkumar Patel
*Assistant Examiner* — Jose M Diaz
(74) *Attorney, Agent, or Firm* — Winston Hsu; Scott Margo

(57) ABSTRACT

A method of fabricating flexible display device includes providing a flexible display panel having an uneven surface, and forming at least one filling layer on the uneven surface of the flexible display panel. The filling layer includes an organic filling layer polymerized by a precursor layer, or an inorganic filling layer including nanometer-scale carbon structure.

14 Claims, 8 Drawing Sheets

METHOD OF FABRICATING FLEXIBLE DISPLAY DEVICE

BACKGROUND OF THE INVENTION

1. Field of the Invention

The present invention relates to a method of fabricating a flexible display device, and more particularly, to a method of fabricating a flexible display device that reduces the residual gas during the process of attaching a barrier layer.

2. Description of the Prior Art

Since flexible display device, such as flexible organic light-emitting diode (OLED) display device, has flexibility, it has been expected to be applied to electronic products such as electronic papers in the future. Generally, in order to enhance the water-resistance and structure strength, a barrier film is attached on the surface of the flexible display panel. However, there exist some gaps between the substrate of the flexible display panel and the display elements fabricated thereon, forming an uneven surface of the flexible display. The uneven surface usually causes gas remaining during attaching the barrier film to the flexible display panel, which forms bubbles in the flexible display device. When the flexible display device is winded or deflected, the bubbles affect the flexible display device to have un-balanced stress which easily damages the display elements.

SUMMARY OF THE INVENTION

It is therefore one of the objectives of the present invention to provide a method of fabricating a flexible display device to avoid generating bubbles caused by residual gas during attaching the barrier film to the flexible display panel.

According to a preferred embodiment of the present invention, a method of fabricating a flexible display device is provided. The method includes providing a flexible display panel, wherein the flexible display panel has an uneven surface; forming at least one precursor layer on the uneven surface of the flexible display panel, and performing a polymerization process to polymerize the precursor layer to form at least one filling layer.

According to another preferred embodiment of the present invention, a method of fabricating a flexible display device is further provided, which includes providing a flexible display panel, wherein the flexible display panel has an uneven surface, and forming at least one filling layer on the uneven surface of the flexible display panel, wherein the filling layer includes a plurality of carbon nanotubes, carbon nanoparticles or carbon nanowires.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1:
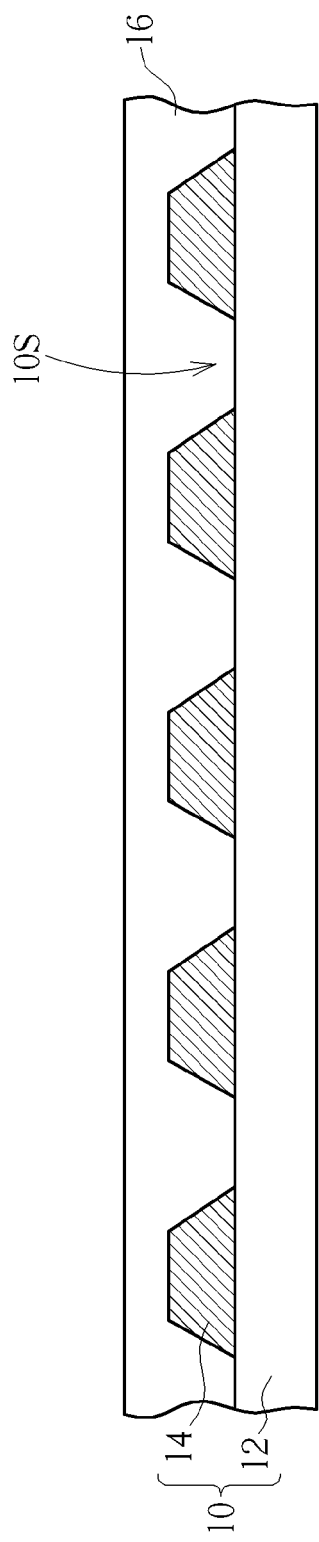
FIG. 1 to FIG. 3 are schematic diagrams illustrating a method of fabricating a flexible display device according to a first preferred embodiment of the present invention.
Figure 2:
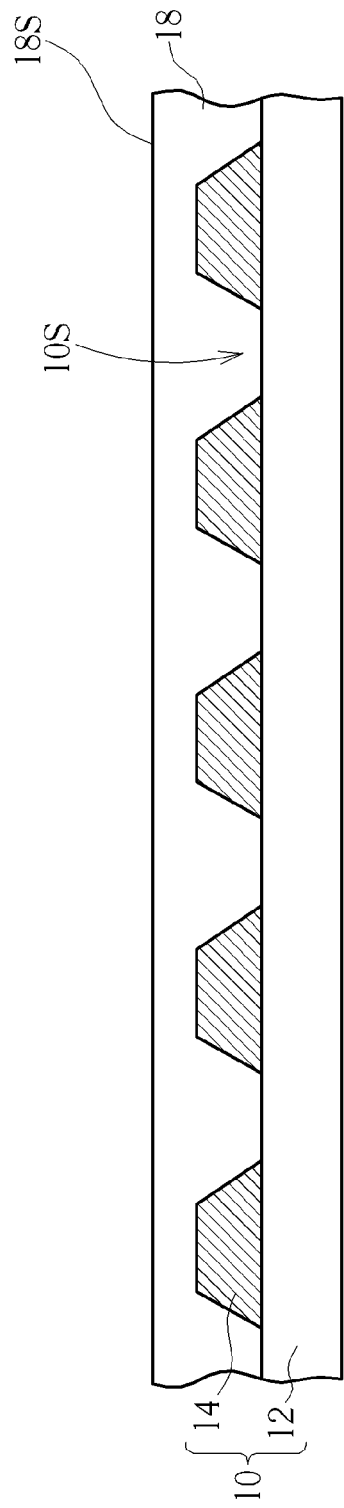
Figure 3:
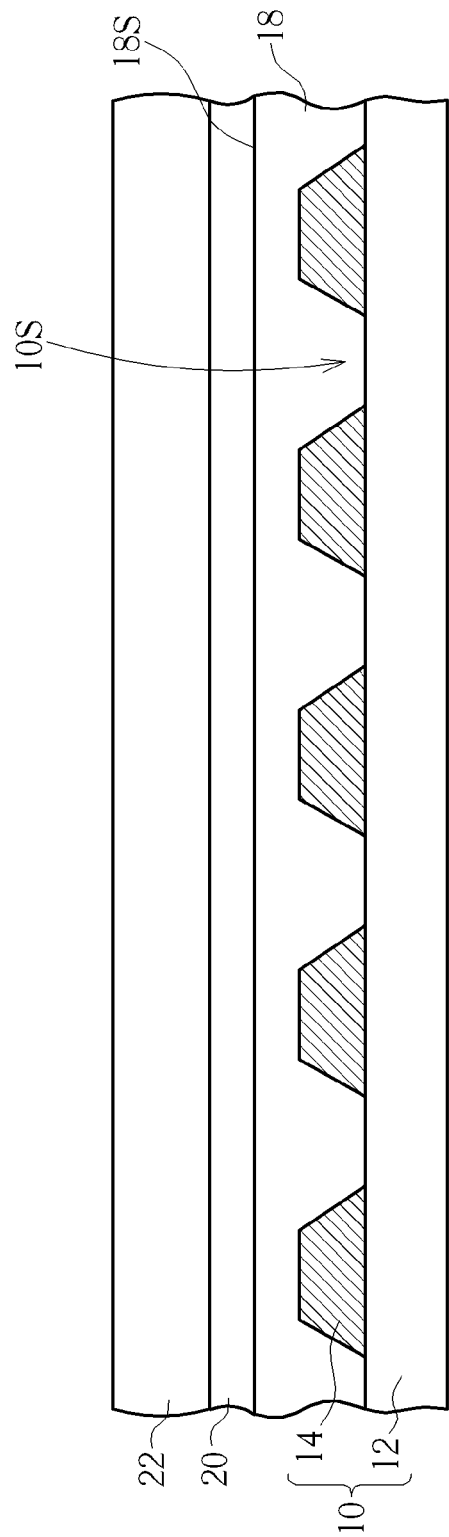

Please refer to FIG. 1 to FIG. 3. FIG. 1 to FIG. 3 are schematic diagrams illustrating a method of fabricating a flexible display device according to a first preferred embodiment of the present invention. As shown in FIG. 1, first, a flexible display panel 10 is provided. In the present invention, the flexible display panel 10 may be, but not limited to, a flexible electroluminescent display panel, such as a flexible OLED display panel. However, the flexible display panel 10 may be another flexible display panel of various types, such as an electrophoretic display panel. The flexible display panel 10 mainly includes a substrate 12 and a plurality of display elements 14 disposed on the substrate 12. The substrate 12 may include a plastic substrate for example. The display elements 14 may include OLEDs, switch thin film transistor (TFT) elements, driving TFT elements and capacitor elements or any essential elements of an OLED display panel. The flexible display panel 10 has an uneven surface 10S, and the uneven surface 10S is resulted from the gap of the surfaces of the display elements 14 and the surface of the substrate 12. For instance, the gap of the surfaces of the display elements 14 and the surface of the substrate 12 may be about 0.5 micrometer (μm) to micrometers. Then, at least one precursor layer 16 is formed on the uneven surface 10S of the flexible display panel 10. In this embodiment, the precursor layer 16 may be a small molecule precursor layer, and the precursor layer 16 may include an acrylic-based precursor layer. For example, the acrylic-based precursor layer of this embodiment may include the precursor as the following chemical formula (1):

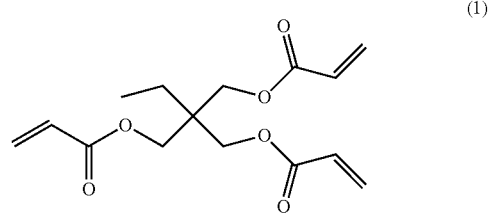 [SMILES: C=CC(=O)OCC(CC)(COC(=O)C=C)COC(=O)C=C]

According to the present invention, the precursor layer 16 is not limited to the acrylic-based precursor layer, and may be a parylene-based precursor layer for example or include other suitable small molecules.

In this embodiment, the precursor layer 16 may be formed on the uneven surface 10S of the flexible display panel 10 through a vacuum thermal evaporation process as an example. During the vacuum thermal evaporation process, the temperature of the substrate 12 may be controlled to be preferably less than 90° C. for instance, and the temperature of the evaporation source may be controlled to be preferably greater than 160° C., but not limited thereto. The formation of the precursor layer 16 is not limited to the vacuum thermal evaporation process. In a variant embodiment, the precursor layer 16 may be formed through a printing process, such as an injection process, wherein a leveling process may be further performed after the precursor layer 16 is formed through the injection process.

As shown in FIG. 2, a polymerization process is then performed to polymerize the precursor layer 16 to at least one filling layer 18 with big molecules. In this embodiment, if the precursor layer 16 is an acrylic-based precursor layer and formed through a vacuum thermal evaporation process, the polymerization process may include an ultraviolet (UV) curing process or using a blue light with a wavelength less than 420 nm as the light source to illuminate the precursor layer 16, wherein the wavelength of the UV light source is, but not limited to, 365 nm for example and the energy of the UV light source is preferably greater than 1000 mJ/cm$^2$ for example. In this embodiment, when the small molecule as chemical formula (1) is selected as the precursor of the precursor layer 16, the filling layer 18 will include lauryl acrylate as the chemical formula (2) after the polymerization process:

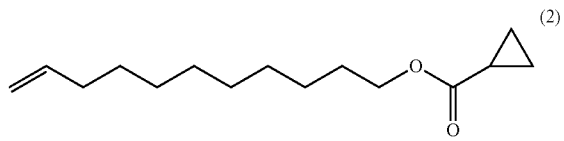 [SMILES: C=CCCCCCCCCCOC(=O)C1CC1]

(2)

In addition, if a parylene-based precursor layer is selected as the precursor layer 16 and is formed through a vacuum thermal evaporation process, a polymerizing reaction will directly occur in the precursor layer 16 during the vacuum thermal evaporation process, and thus no additional UV curing process is needed. Further, if the precursor layer 16 is formed through a printing process, no matter an acrylic-based precursor layer or an parylene-based precursor layer is selected as the precursor layer 16, the polymerization process, in addition to the UV curing process, is performed in a nitrogen environment, whose concentration of water and oxygen is less than or equal to 10 ppm, but not limited thereto.

In this embodiment, the thickness of the filling layer 18 may be substantially between about 0.5 μm and 1.5 μm, preferably between about 0.5 μm and 1 μm, and the spaces formed by the gap of the surfaces of the display elements 14 and the surface of the substrate 12 is filled with the filling layer 18 to form an even surface 18S.

Then, as shown in FIG. 3, an adhesive layer 20 is used for attaching a barrier film 22 onto the even surface 18S of the filling layer 18 to complete fabricating the flexible display device of this embodiment. The barrier film 22 may be an organic barrier film, an inorganic barrier film, or an organic/inorganic composite-layered barrier film for example, and the water vapor transmission rate (WVTR) of the barrier film 22 is substantially better than 10$^{-3}$ g/m$^2$/day, preferably between 10$^{-5}$ g/m$^2$/day and 10$^{-6}$ g/m$^2$/day, but not limited thereto.

The method of fabricating the flexible display device of the present invention is not limited by the aforementioned embodiment and may have other different preferred or variant embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 4:
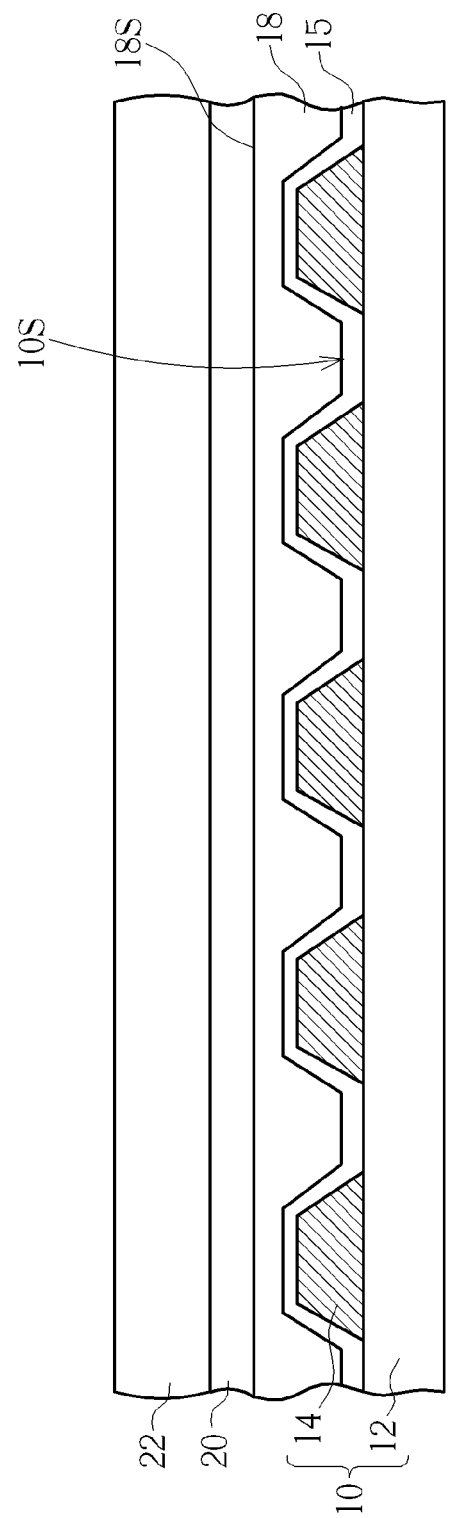
FIG. 4 is a schematic diagram illustrating a method of fabricating a flexible display device according to a first variant embodiment of the first preferred embodiment of the present invention.

With reference to FIG. 4, FIG. 4 is a schematic diagram illustrating a method of fabricating a flexible display device according to a first variant embodiment of the first preferred embodiment of the present invention. As shown in FIG. 4, different from the first preferred embodiment, its first variant embodiment further includes forming at least one adhesion-enhanced layer 15 on the flexible display panel 10 before forming the filling layer 18, in order to improve the adhering effect between the filling layer 18 and the flexible display panel 10. The adhesion-enhanced layer 15 may be formed through, but not limited to, a physical vapor deposition (PVD) process, a chemical vapor deposition (CVD) process, or an atomic layer deposition (ALD) process. The filling layer 18 has an event surface 18S, and the thickness of the adhesion-enhanced layer 15 is substantially between about 0.5 μm and 1.5 μm, and preferably between about 0.5 μm and 1 μm, but not limited thereto. Further, the total thickness of the adhesion-enhanced layer 15 and the filling layer 18 is, but not limited to, preferably smaller than 2 μm, substantially. The adhesion-enhanced layer 15 may include a metal layer, a metal oxide layer, a metal nitride layer, a silicon oxide layer, or a silicon nitride layer. It is noteworthy that if a conductive material, such as a metal material, is selected as the composition of the adhesion-enhanced layer 15, an insulating layer (not shown) has to be first formed on the display elements 14 before forming the adhesion-enhanced layer 15 in order to avoid electrical connection between the adhesion-enhanced layer 15 and the electrodes of the display elements 14, occurring short-circuitry. After forming the filling layer 18, an adhesive layer 20 is used for attaching the barrier film 22 onto the even surface 18S of the filling layer 18, so as to complete fabricating the flexible display device of the first variant embodiment.

Figure 5:
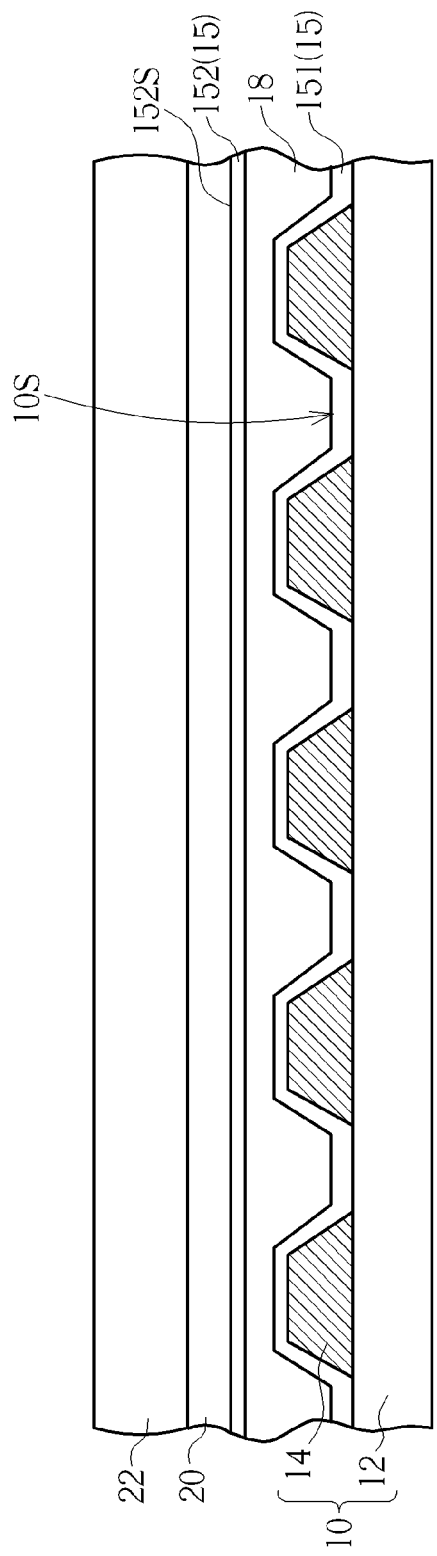
FIG. 5 is a schematic diagram illustrating a method of fabricating a flexible display device according to a second variant embodiment of the first preferred embodiment of the present invention.

With reference to FIG. 5, FIG. 5 is a schematic diagram illustrating a method of fabricating a flexible display device according to a second variant embodiment of the first preferred embodiment of the present invention. As shown in FIG. 5, different from the first variant embodiment, the adhesion-enhanced layer 15 in the method of fabricating the flexible display device of the second variant embodiment includes a first adhesion-enhanced layer 151 and a second adhesion-enhanced layer 152, wherein the first adhesion-enhanced layer 151 is formed between the flexible display panel 10 and the filling layer 18 and the second adhesion-enhanced layer 152 is formed on the filling layer 18. The second adhesion-enhanced layer 152 also has an even surface 152S. In the second variant embodiment, the sum of the thicknesses of the first adhesion-enhanced layer 151, the filling layer 18, and the second adhesion-enhanced layer 152 is preferably less than, but not limited to, 2 μm, substantially. Then, an adhesive layer 20 is used for attaching a barrier film 22 onto the second adhesion-enhanced layer 152, to complete fabricating the flexible display device of the second variant embodiment.

Figure 6:
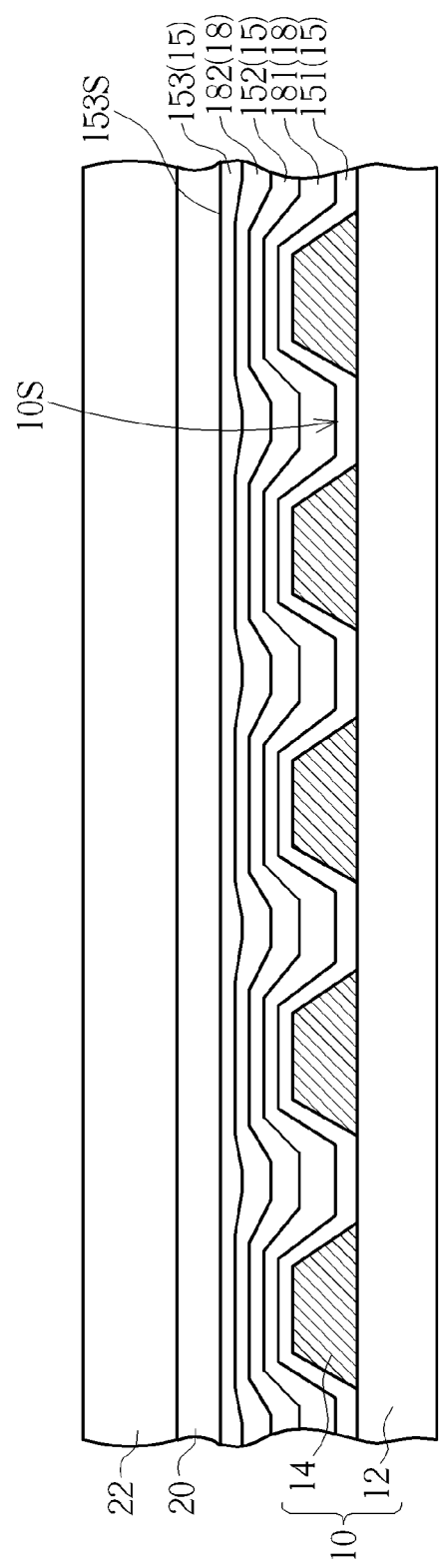
FIG. 6 is a schematic diagram illustrating a method of fabricating a flexible display device according to a third variant embodiment of the first preferred embodiment of the present invention.

With reference to FIG. 6, FIG. 6 is a schematic diagram illustrating a method of fabricating a flexible display device according to a third variant embodiment of the first preferred embodiment of the present invention. As shown in FIG. 6, the difference of the method of fabricating a flexible display device of the third variant embodiment from the second variant embodiment includes that the adhesion-enhanced layer 15 comprises a first adhesion-enhanced layer 151, a second adhesion-enhanced layer 152, and a third adhesion-enhanced layer 153, and the filling layer 18 comprises a first filling layer 181 and a second filling layer 182, wherein the composition layers of the adhesion-enhanced layer 15 and the filling layer 18 are stacked alternately, layer by layer. In other words, the first filling layer 181 is formed between the first adhesion-enhanced layer 151 and the second adhesion-enhanced layer 152, and the second filling layer 182 is formed between the second adhesion-enhanced layer 152 and the third adhesion-enhanced layer 153. The third adhesion-enhanced layer 153 has an even surface 153S. In the third variant embodiment, the total thickness of the first adhesion-enhanced layer 151, the first filling layer 181, the second adhesion-enhanced layer 152, the second filling layer 182, and the third adhesion-enhanced layer 153 is preferably less than, but not limited to, 5 μm, substantially. Then, an adhesive layer 20 is used for attaching a barrier film 22 onto the third adhesion-enhanced layer 153, so as to complete fabricating the flexible display device of the third variant embodiment.

Figure 7:
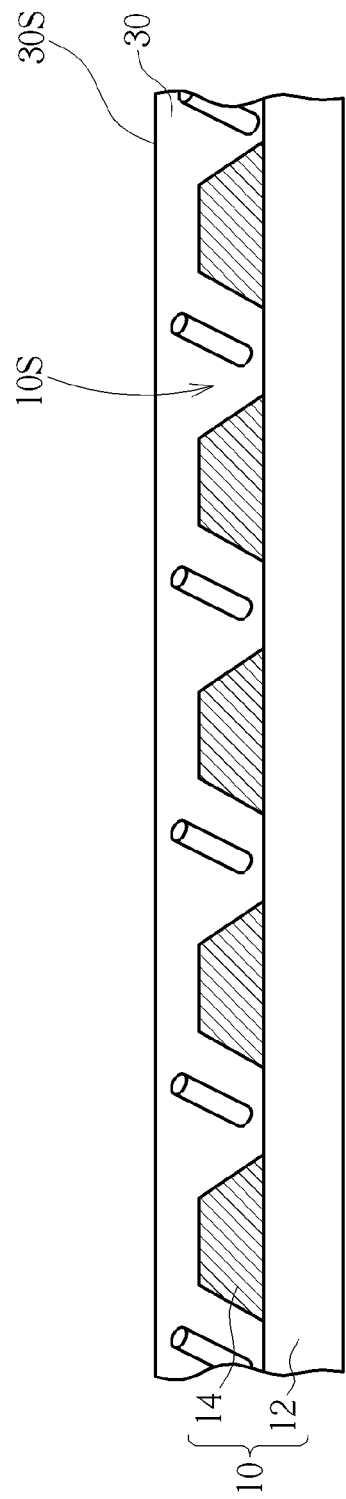
FIG. 7 and FIG. 8 are schematic diagrams illustrating a method of fabricating a flexible display device according to a second preferred embodiment of the present invention.
Figure 8:
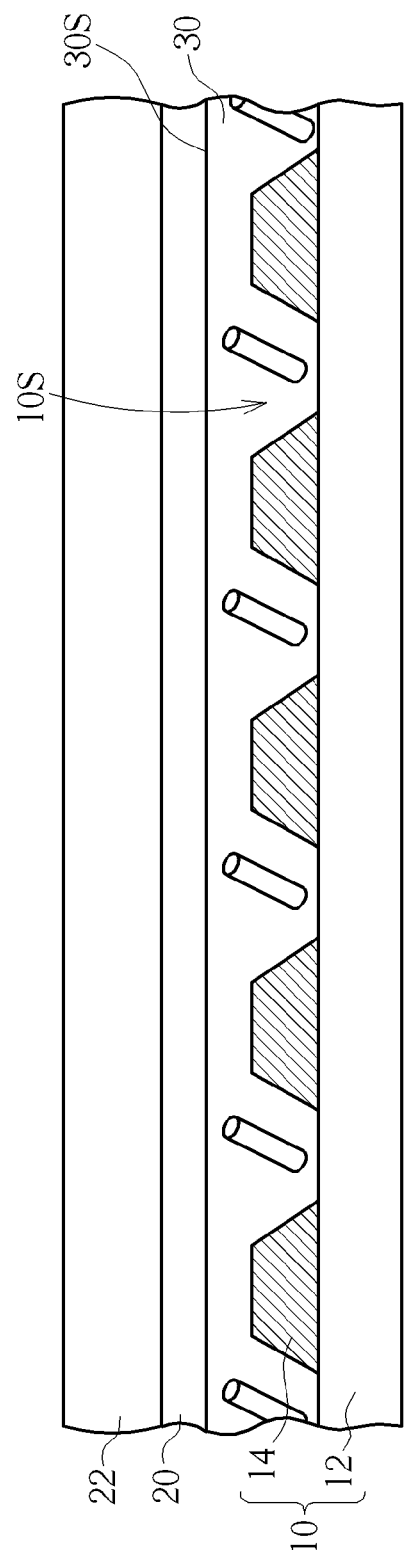

Please refer to FIG. 7 and FIG. 8. FIG. 7 and FIG. 8 are schematic diagrams illustrating a method of fabricating a flexible display device according to a second preferred embodiment of the present invention. As shown in FIG. 7, a flexible display panel 10 is provided, wherein the flexible display panel 10 includes a substrate 12 and a plurality of display elements 14 disposed on the substrate 12. The flexible display panel 10 has an uneven surface 10S, which is resulted from the gap between the surfaces of the display elements 14 and the surface of the substrate 12. Then, at least one filling layer 30 is formed on the uneven surface 10S of the flexible display panel 10, wherein the filling layer 30 has an even surface 30S. Different from the filling layer 18 of the first preferred embodiment, which is an organic filling layer formed from a precursor layer 16 through a polymerization process, the filling layer 30 of the second preferred embodiment is an inorganic filling layer and may include a nanometer-scale carbon structure layer, such as carbon nanotubes, carbon nanoparticles, or carbon nanowires. In this embodiment, the filling layer 30 may be formed through a CVD process, but not limited thereto. As shown in FIG. 8, an adhesive layer 20 is subsequently used for attaching a barrier film 22 onto the even surface 30S of the filling layer 30, so as to complete fabricating of the flexible display device of this embodiment.

The difference of the first preferred embodiment and the second preferred embodiment of the present invention includes that an organic filling layer polymerized from a precursor layer is used in the first preferred embodiment, while an inorganic filling layer is used in the second preferred embodiment, such as a layer of carbon nanotubes, carbon nanoparticles, or carbon nanowires. In the second preferred embodiment, the thickness of the filling layer 30 may be the same as that mentioned in the first embodiment, thus no redundant description is illustrated herein. In addition, the method of fabricating a flexible display device of the second preferred embodiment may include other variant embodiments, such as the variant embodiments mentioned in FIG. 4 to FIG. 6.

In conclusion, the method of fabricating a flexible display device of the present invention includes forming a filling layer, which provides a planarization effect, on the surface of the flexible display panel before attaching the barrier film onto the flexible display panel with the adhesive layer, thus avoiding remaining gas during attaching the barrier film to the flexible display panel, which reduces the reliability and durability of the flexible display device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a flexible display device, comprising:
   providing a flexible display panel having an uneven surface;
   forming at least one precursor layer on the uneven surface of the flexible display panel;
   performing a polymerization process to polymerize the precursor layer to at least one filling layer;
   forming at least one adhesion-enhanced layer on the flexible display panel, wherein the adhesion-enhanced layer comprises a first adhesion-enhanced layer, a second adhesion-enhanced layer and a third adhesion-enhanced layer, the filling layer comprises a first filling layer and a second filling layer, the first filling layer is formed between the first adhesion-enhanced layer and the second adhesion-enhanced layer, the second filling layer is formed between the second adhesion-enhanced layer and the third adhesion-enhanced layer; and
   using an adhesive layer to attach a barrier film on the third adhesion-enhanced layer, wherein the third adhesion-enhanced layer has an even surface.

2. The method of claim 1, wherein the precursor layer is formed on the uneven surface of the flexible display panel through a vacuum thermal evaporation process or a printing process.

3. The method of claim 1, wherein the precursor layer comprises an acrylic-based precursor layer or a parylene-based precursor layer.

4. The method of claim 1, wherein the adhesion-enhanced layer comprises a metal layer, a metal oxide layer, a metal nitride layer, a silicon oxide layer, or a silicon nitride layer.

5. The method of claim 1, wherein the flexible display panel comprises a substrate and a plurality of display elements disposed on the substrate, and the uneven surface is formed by a gap between a surface of the display elements and a surface of the substrate.

6. A method of fabricating a flexible display device, comprising:
   providing a flexible display panel, wherein the flexible display panel has an uneven surface; and
   forming at least one filling layer on the uneven surface of the flexible display panel, wherein the filling layer comprises a plurality of carbon nanotubes, carbon nanoparticles, or carbon nanowires.

7. The method of claim 6, wherein the filling layer is formed through a CVD process.

8. The method of claim 6, further comprising using an adhesive layer to attach a barrier film on the filling layer, wherein the filling layer has an even surface.

9. The method of claim 6, further comprising forming at least one adhesion-enhanced layer on the flexible display panel.

10. The method of claim 9, wherein the adhesion-enhanced layer comprises a metal layer, a metal oxide layer, a metal nitride layer, a silicon oxide layer, or a silicon nitride layer.

11. The method of claim 9, wherein the adhesion-enhanced layer is formed between the flexible display panel and the filling layer.

12. The method of claim 9, wherein the adhesion-enhanced layer comprises a first adhesion-enhanced layer and a second adhesion-enhanced layer, the first adhesion-enhanced layer is formed between the flexible display panel and the filling layer, and the second adhesion-enhanced layer is formed on the filling layer.

13. The method of claim 12, further comprising using an adhesive layer to attach a barrier film on the second adhesion-enhanced layer, wherein the second adhesion-enhanced layer has an even surface.

14. The method of claim 9, wherein the adhesion-enhanced layer comprises a first adhesion-enhanced layer, a second adhesion-enhanced layer, and a third adhesion-enhanced layer, the filling layer comprises a first filling layer and a second filling layer, the first filling layer is formed between the first adhesion-enhanced layer and the second adhesion-enhanced layer, the second filling layer is formed between the second adhesion-enhanced layer and the third adhesion-enhanced layer, and the method further comprises using an adhesive layer to attach the barrier film on the third adhesion-enhanced layer, wherein the third adhesion-enhanced layer has an even surface.

* * * * *